US006813484B1

(12) United States Patent
Tolson

(10) Patent No.: US 6,813,484 B1
(45) Date of Patent: *Nov. 2, 2004

(54) VOLTAGE CONTROLLED BAND-PASS FILTER

(75) Inventor: Nigel James Tolson, Berkshire (GB)

(73) Assignee: NEC Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/540,982

(22) Filed: Mar. 31, 2000

Related U.S. Application Data

(63) Continuation-in-part of application No. 09/261,184, filed on Mar. 3, 1999.

(30) Foreign Application Priority Data

Mar. 5, 1998  (GB) .............................................. 9804708

(51) Int. Cl.[7] ................................................ H04K 3/00
(52) U.S. Cl. ...................... 455/307; 455/260; 327/552; 327/553; 327/557
(58) Field of Search ................................. 455/266, 307, 455/256, 257, 258, 259, 260, 264, 317; 327/552, 553, 557

(56) References Cited

U.S. PATENT DOCUMENTS

| 4,032,852 A | * | 6/1977 | Hulls et al. |
| 4,581,643 A | * | 4/1986 | Carlson |
| 5,230,094 A | * | 7/1993 | Kitching et al. |
| 5,281,931 A | * | 1/1994 | Bailey et al. |

* cited by examiner

*Primary Examiner*—Lee Nguyen
*Assistant Examiner*—Huy D Nguyen
(74) *Attorney, Agent, or Firm*—Sughrue Mion, PLLC

(57) ABSTRACT

A voltage controlled band-pass filter is in a phase locked loop. The output from a phase detector is applied through a loop filter as the control voltage. The phase detector output is proportional to the difference in phase between first and second signals input to the phase detector. The first signal is fed directly from a local oscillator to the phase detector. The second signal is fed from the local oscillator to the phase detector through the voltage controlled band-pass filter.

14 Claims, 1 Drawing Sheet

VOLTAGE CONTROLLED BAND-PASS FILTER

RELATED APPLICATION

This application is a continuation-in-part application of application Ser. No. 09/261,184, filed Mar. 3, 1999.

BACKGROUND OF THE INVENTION

Field of the Invention

This invention relates to voltage controlled band-pass filters and in particular it relates to the use of such filters in radio transmitter/receivers.

Description of the Related Art

A reduction in cost and an improvement in reliability are amongst the benefits that may be obtained when it is possible to achieve a reduction in the number of separate components of a radio transmitter/receiver. Improvements in the performance of the radio may also be obtained by means of the integration of components previously required to be provided separately. Also a minimum bandwidth for the IF filter, consistent with adequate reception of the wanted signal will enhance receiver performance considerably.

SUMMARY OF THE INVENTION

It is an object of the present invention to provide an improved means for frequency and channel selection for both receiver and transmitter in a radio transmitter/receiver while reducing the number of separate components required.

According to the invention there is provided a voltage controlled band-pass filter in a phase locked loop with the output from a phase detector applied through a loop filter as a control voltage, the output from the phase detector being proportional to the difference in phase of first and second signals input to the phase detector with the first signal fed directly to the phase detector from a local oscillator and the second signal fed from said local oscillator to the phase detector through the voltage controlled band-pass filter.

DETAILED DESCRIPTION OF THE INVENTION

Figure 1:
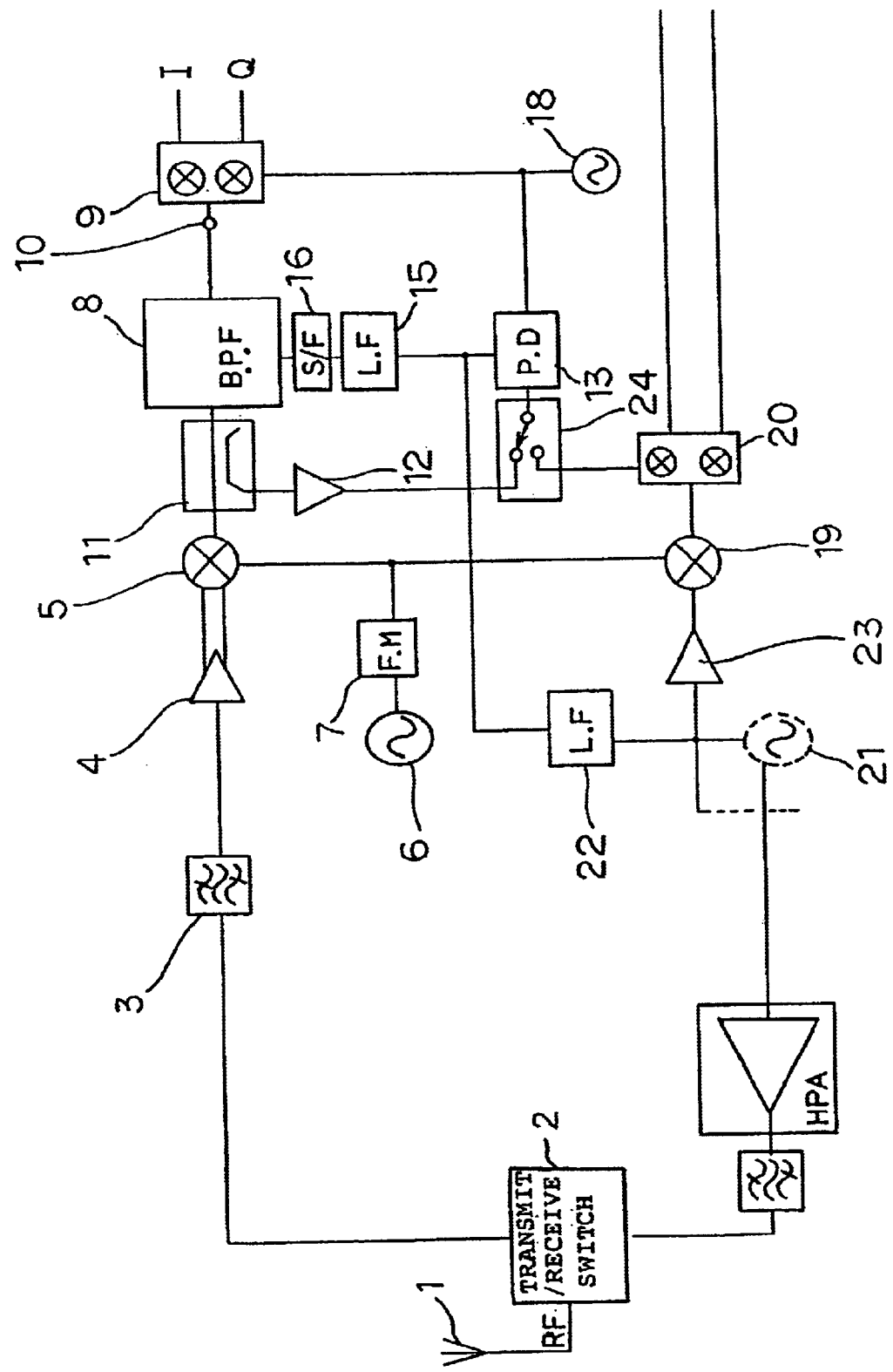
FIG. 1 is a block diagram of part of a radio transmitter/receiver.

An example of the invention will now be described with reference to the sole FIGURE 1 which is a block diagram of part of a radio transmitter/receiver incorporating a voltage controlled band-pass filter constructed in accordance with the invention.

With reference to FIG. 1, an incoming RF signal from an antenna 1 is fed via transmit/receive switch 2 and band-pass filter 3 to low noise amplifier 4. The function of low noise amplifier (LNA) 4 is to enhance the signal to noise performance of the receiver and to reduce any unwanted transmission from the receiving antenna at radio frequencies (RF). The amplified signal from LNA 4 is then mixed in mixer 5 with the output from first local oscillator (LO) 6.

The frequency of LO 6 is fixed and the output from LO 6 is doubled in frequency by frequency doubler 7 before passing to mixer 5, at twice the frequency of LO 6, to mix with the incoming, filtered and amplified RF signals, to produce an intermediate frequency (IF) output from mixer 5.

Use of the frequency doubler 7 enables a lower frequency oscillator to be used as a local oscillator which provides an easing of tolerances so as to permit discrete implementation of the oscillator. The output from mixer 5 is fed to the input 24 of an active band-pass filter 8 forming part of a phase locked loop (PLL). Filter 8 is a voltage controlled band-pass filter and may be constructed as an MMIC active filter. A description of an MMIC active filter can be found in IEEE Transactions on Microwave Theory and Techniques, Volume 37, Number 12, Dec. 1989, Manfred J. Schindler and Yusuke Tajima. The bandwidth of filter 8 is sufficient to accommodate a single channel.

The filtered IF signals from filter 8 are fed to mixer 9. Local oscillator 18 provides an output at the IF of the reception channel required. The isolation of the local oscillator signal from the incoming IF port 10 provided by mixer 9 is typically only 15 dB and therefore a substantial breakthrough of the local oscillator energy to the IF port 10 occurs.

The energy from the local oscillator appearing at IF port 10 passes through filter 8 with a change of phase. The amount and direction of the phase change of the local oscillator breakthrough passing through the filter 8 is determined by the difference between the frequency of the local oscillator breakthrough and the current center frequency of the tunable filter 8.

The local oscillator energy passing through filter 8 is coupled via RF coupler 11 to amplifier 12, where it is amplified and applied to a port of phase detector 13. A further output from local oscillator 18 is fed directly (i.e. without a significant change of phase) to a second port of phase detector 13. Phase detector 13 compares the phase of the signals appearing at its ports and provides an output proportional to the difference in phase of the two signals.

The local oscillator breakthrough from the mixer is unwelcome and efforts by device manufacturers to provide better quality components are likely to result in mixers with improved isolation characteristics. Where the local oscillator breakthrough at 10 is insufficient to provide a good signal at the phase detector 13, or where it is preferred to do so, the local oscillator 18 output may be fed directly into the output 27 of the filter 8 by the operation of switch 25.

The output from phase detector 13, the error signal, is fed to loop filter 15 and the output voltage from the loop filter is applied, via sample and hold circuit 16 to the voltage control input of the voltage controlled filter 8 thereby forming a closed locked loop. The action of the closed locked loop is to drive the center frequency of the band-pass filter 8 towards the frequency of the local oscillator, the local oscillator frequency having been set for use with the selected operating channel.

A sample and hold circuit 16 is included in the control loop between loop filter 15 and voltage controlled filter 8. The sample and hold circuit is capable of being switched to provide a fixed voltage at the control input of the voltage controlled band-pass filter 8. This would occur when the center frequency of filter 8 approximates to the center frequency of the selected channel bandwidth and during 'receive' for a TDMA system. When the control voltage for filter 8 is to be maintained at a fixed value, parts of the control circuit are disabled thereby to effect a saving of power during normal operation in a single channel.

The receiver phase locked loop does not operate while the sample and hold circuit 16 supplies a fixed voltage to control filter 8. When a different channel is selected the phase locked loop circuit is enabled and the filter is tuned to accept the new channel frequencies.

The I and Q outputs from mixer 9 which are at baseband frequencies are passed to amplification stages and then to standard processing circuits such as are well known in the art; see for example 'Mobile Radio Communications' by R. Steele (Ed) 1992, published by John Wiley & Sons.

When the transmitter is to be aligned to the correct channel frequency the phase detector 13 and the fixed frequency local oscillator 6 and frequency doubler 7 are included in the transmitter tracking loop. The use of these components for both receiver and transmitter channel selection provides a reduction in the number and cost of components. A smaller area of silicon is required also. Additionally there is no need for a surface acoustic wave (SAW) filter to be included in the IF stage of the receiver. SAW filters normally cannot be integrated fully into the ASIC (application specific integrated circuit) because of the need for hermetic sealing.

The transmitter tracking PLL comprises VCO 21, mixer 19 and amplifier 23 and is activated by switch 24. By the action of switch 24 the phase detector 13 forms part of either one of the phase locked loops for the transmitter tracking loop or the receiver voltage controlled band-pass filter control loop with a consequent reduction in the component count.

A further saving of components is achieved by means of the use of an output from the doubler 7 as input to mixer 19. The transmitter tracking loop therefore, while otherwise operating in accordance with prior art methods, does not require a UHF oscillator and shares its phase detector with the receiver voltage controlled band-pass filter control loop.

The tunable band-pass filter as described is not limited to the example given and other applications will be apparent to those skilled in the art e.g. as a pre-selector filter for a homodyne receiver.

What is claimed is:

1. A voltage controlled band-pass filter in a phase locked loop with the output from a phase detector applied through a loop filter as a control voltage, the output from the phase detector being proportional to the difference in phase of first and second signals input to the phase detector with the first signal fed directly to the phase detector from a local oscillator and the second signal fed from said local oscillator to the phase detector through the voltage controlled band-pass filter.

2. A voltage controlled band-pass filter as in claim 1 in which the output from the loop filter to the voltage controlled band-pass filter is via a sample and hold circuit switched to supply a fixed control voltage at the control input of the voltage controlled band-pass filter when the tuning control loop is not required to operate.

3. A voltage controlled band-pass filter as in claim 2 in which the signal fed to the phase detector through the voltage controlled band-pass filter is obtained as leakage from a radio receiver down-conversion mixer.

4. A voltage controlled band-pass filter as in claim 2 in which the signal fed to the phase detector through the voltage controlled band-pass filter is fed from the local oscillator to the voltage controlled band-pass filter by the action of a switch.

5. A voltage controlled band-pass filter as in claim 2 in which the signal fed to the phase detector through the voltage controlled band-pass filter is fed from the IF input of the filter to the phase detector by a coupler and amplifier.

6. A voltage controlled band-pass filter as in claim 2 forming part of a transmitter/receiver and in which, by the action of a switch, the phase detector forms part of either the transmitter tracking loop or the receiver voltage controlled band-pass filter control loop.

7. A voltage controlled band-pass filter as in claim 2 in which the voltage controlled band-pass filter is implemented as an integral part of an ASIC receiver.

8. A voltage controlled band-pass filter as in claim 2 forming part of a transmitter/receiver and in which the voltage controlled band-pass filter is an active filter.

9. A voltage controlled band-pass filer as in claim 1 in which the signal fed to the phase detector through the voltage controlled band-pass filter is obtained as leakage from a radio receiver down-conversion mixer.

10. A voltage controlled band-pass filter as in claim 1 in which the signal fed to the phase detector through the voltage controlled band-pass filter is fed from the local oscillator to the voltage controlled band-pass filter by the action of a switch.

11. A voltage controlled band-pass filter as in claim 1 in which the signal fed to the phase detector through the voltage controlled band-pass filter is fed from the IF input of the filter to the phase detector by a coupler and amplifier.

12. A voltage controlled band-pass filter as in claim 1 forming part of a transmitter/receiver and in which, by the action of a switch, the phase detector forms part of either the transmitter tracking loop or the receiver voltage controlled band-pass filter control loop.

13. A voltage controlled band-pass filter as in claim 1 in which the voltage controlled band-pass filter is implemented as an integral part of an ASIC receiver.

14. A voltage controlled band-pass filter as in claim 1 forming part of a transmitter/receiver and in which the voltage controlled band-pass filter is an active filter.

* * * * *